United States Patent [19]

James

[11] 4,017,332

[45] Apr. 12, 1977

[54] SOLAR CELLS EMPLOYING STACKED OPPOSITE CONDUCTIVITY LAYERS

[75] Inventor: Lawrence W. James, Palo Alto, Calif.

[73] Assignee: Varian Associates, Palo Alto, Calif.

[22] Filed: Mar. 29, 1976

[21] Appl. No.: 671,891

Related U.S. Application Data

[63] Continuation of Ser. No. 553,850, Feb. 27, 1975, abandoned.

[52] U.S. Cl. .............................. 136/89 PC; 357/16; 357/30; 357/37; 136/89 SG; 136/89 CC
[51] Int. Cl.$^2$ ........................................ H01L 31/06
[58] Field of Search ................. 136/89; 357/30, 16, 357/37

[56] References Cited

UNITED STATES PATENTS

| | | | |
|---|---|---|---|
| 2,949,498 | 8/1960 | Jackson | 136/89 |
| 3,015,762 | 1/1962 | Shockley | 317/234 |
| 3,046,459 | 7/1962 | Anderson et al. | 317/235 |
| 3,186,873 | 6/1965 | Dunlap, Jr. | 136/89 |

FOREIGN PATENTS OR APPLICATIONS

| | | | |
|---|---|---|---|
| 1,129,220 | 1/1957 | France | 136/89 |

*Primary Examiner*—John H. Mack
*Assistant Examiner*—Aaron Weisstuch
*Attorney, Agent, or Firm*—Stanley Z. Cole; Robert K. Stoddard; Richard B. Nelson

[57] ABSTRACT

A cell for converting received light energy to electrical energy comprises, in the simplest embodiment, four layers of differing types of semiconductive material stacked so as to form three opposite conductivity junctions. The outer two, "active", junctions are formed of confronting layers with matched lattice constants so as to provide a plurality of energy converters. The center, "connective", junction is formed by two confronting intermediate layers which have purposely mismatched lattice constants so as to provide a lattice defect site surrounding the center junction. Majority carriers (electrons and holes) will recombine at the lattice defects. This will cause the connective junction, although of apparently reverse-biased opposite conductivity type layers, to act as a low resistance ohmic connection or substantial short circuit so as to connect the energy converting portions in series. Due to the stacked arrangement of junctions in which the layers forming the active junctions have increasingly lower bandgaps toward the bottom of the stack, incident photons are converted to electrical energy with far greater efficiency than in a single-junction arrangement. Preferably the stacked layers are formed of suitably-doped epitaxially-grown layers of compounds of III–V elements (Ga, In, Al, As, P, Sb). The number of active junctions is preferably made greater than two, e.g., six is currently regarded as a practical maximum. Low resistance interconnections between the energy converting portions formed by active junctions are provided by connective junctions which are formed of lattice constant mismatched and opposite conductivity confronting layers.

10 Claims, 9 Drawing Figures

FIG. 2A SOLAR CELL-THREE JUNCTIONS (SEMICONDUCTIVE PORTIONS ONLY)

FIG. 3

FIG.4B
ENERGY BANDS

FIG.4A
THREE-ACTIVE JUNCTION
CELL EMPLOYING TUNNELING

SOLAR CELLS EMPLOYING STACKED OPPOSITE CONDUCTIVITY LAYERS

This is a continuation of application Ser. No. 553,850 filed Feb. 27, 1975, now abandoned.

FIELD OF INVENTION

This invention relates generally to the field of energy conversion and particularly to photovoltaic cells for converting radiant energy to electrical energy with substantially greater efficiency than was heretofore available.

PRIOR ART

Heretofore cells for converting radiant energy (e.g., sunlight) to electrical energy were available but had limited efficiency. For example, most such cells could convert incident photons to electrical energy with only a few percent efficiency. Cells are available for converting incident photons to electrical energy with higher efficiencies, e.g., up to twenty percent, but such cells are relatively expensive for the efficiency provided and thus have been limited to use on space satellites and military applications.

There is a great need today for an optical energy conversion cell of substantially increased efficiency. Such a cell could advantageously be used to convert sunlight to electrical current, whereby the demand for energy sources such as fossil fuels, which are limited in supply and growing more expensive, nuclear power plants, which are extremely expensive to construct and have safety and environmental drawbacks, etc., could be alleviated. However the efficiency and cost of photocells presently available has not been satisfactory enough to make solar energy conversion practical, except in the limited applications aforementioned.

One difficulty with increasing the conversion efficiency of solar cells is the difficulty of providing means for efficiently converting sunlight photons incident over a given area to electrical current. This difficulty arises because incident photons from sunlight cover a relatively wide frequency/wavelength spectrum or energy range distribution. A single solar cell, which is sensitive to a limited range of solar wavelengths or photon energies, is able to convert photons of such range to electrical energy with relatively high efficiency. However solar photons with energies above such range will not be converted efficiently by such a cell, and photons with energies below such range will not be converted at all, so that the resulting overall solar energy conversion efficiency of the cell is poor.

While it has been suggested, e.g., in U.S. Pat. 2,949,498 to Jackson, Aug. 16, 1960, to provide a "stack" of solar conversion cells, each of which is sensitive or "tuned" to a particular range of photon energies, thereby to encompass most of the solar spectrum, such a stack heretofore has not been feasible in practice due to the difficulty of providing workable contacts to the various respective layers of the stack. I.e., redoubtable mechanical problems in providing respective contacts to the various layers exist, but even if such contacts could be provided, they would block a significant percentage of photons from reaching subjacent layers. (The aforementioned Jackson patent fails to disclose any practicable contacts or interconnection means.)

It has not been possible to stack cells directly in an efficient arrangement, with contacts provided to only the outer surfaces of the lowermost and uppermost cells, since solar cells usually comprise rectifying junctions. Thus a stack of more than two such junctions will include an intermediate rectifying junction which will block current flow and thus render the cell highly inefficient, if not useless. It has been suggested that such rectifying junctions can be shorted by means of diffused carrier recombination elements, mechanical damage, tunnel junctions, or lattice-constant mismatched layers, but thus far such means have not been accomplished with IIIA–VA materials and have not been effectively accomplished in any other materials.

Accordingly several objects of the present invention are to provide (1) a radiant energy or photovoltaic conversion cell of greatly increased overall efficiency, (2) a practical photovoltaic cell which can convert several photon wavelength or energy ranges, and (3) an energy conversion cell in which plural conversion cells can be stacked efficiently, economically, and practically and in a novel manner. Further objects and advantages of the present invention will be apparent from a consideration of the ensuing description.

Figures 1A, 1B, 1C:
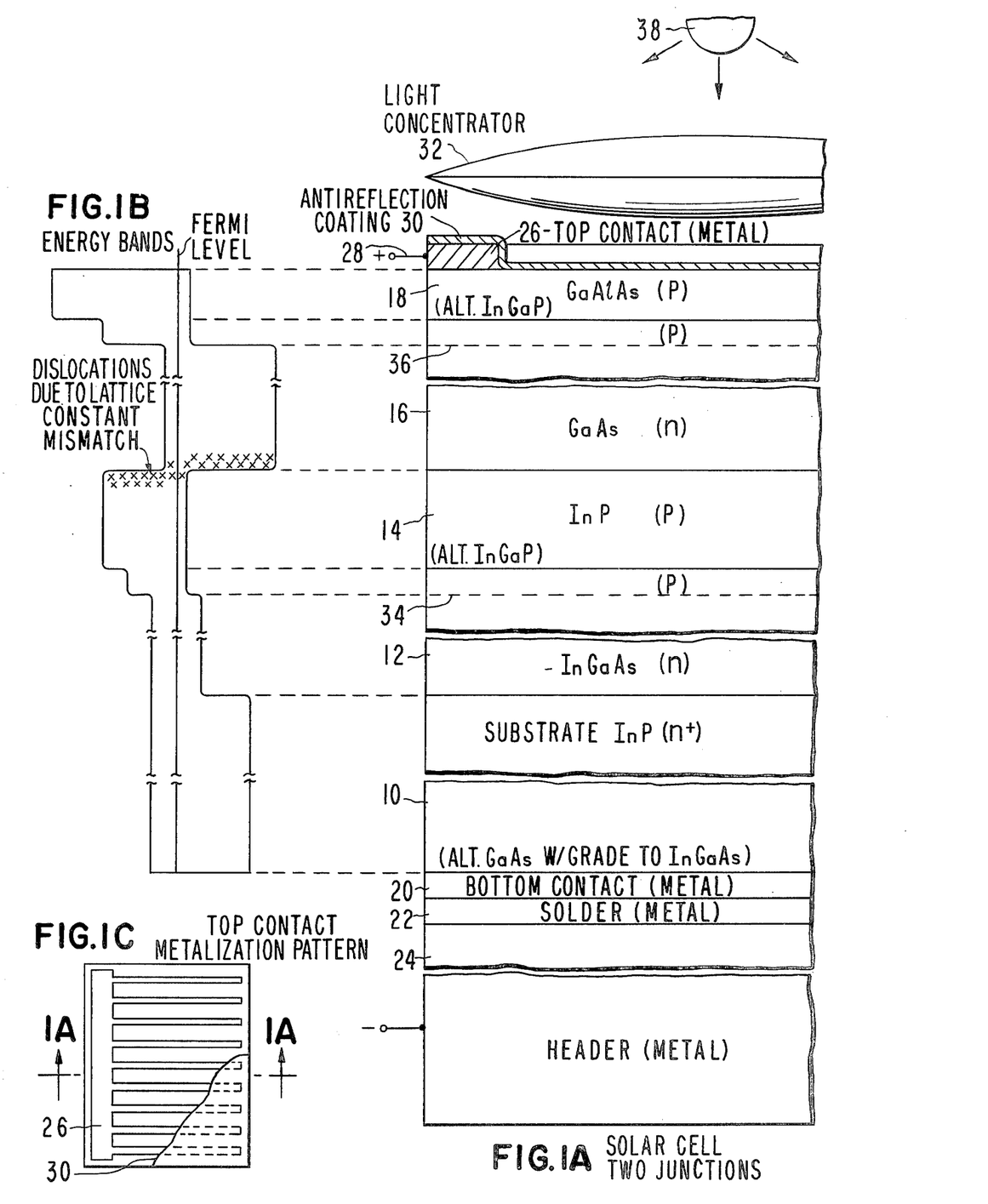
FIG. 1A shows a two-active junction solar cell in accordance with the invention.
FIG. 1B, aligned with FIG. 1A, shows an energy band diagram of the solar cell in FIG. 1A.
FIG. 1C shows a top contact metallization pattern suitable for use with the cell of FIG. 1A.
Figure 1D:
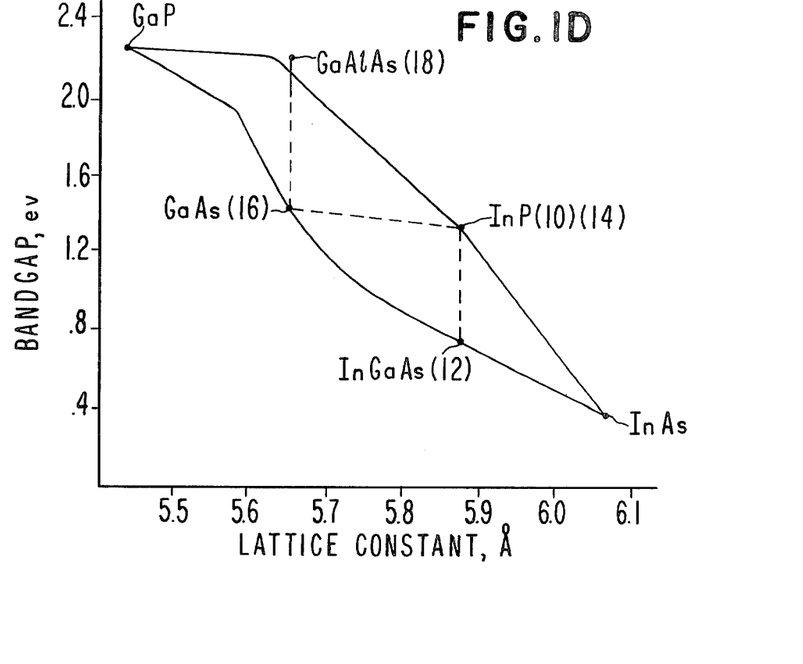
FIG. 1D is a plot of the lattice constant versus bandgap for the semiconductive regions of the cell of FIG. 1A.

FIG. 1—Two-Junction Solar Cell—Description

Prior to discussing the solar cell shown in cross-sectional form in FIG. 1A, it should be noted that while some attempt has been made to provide an indication of scale on the drawings, it is not possible to do so completely due to the great variations in sizes of the dimensions of the various layers in the entire device. For example although the device is shown higher than it is wide, only a small narrow vertical section of the complete device, starting from the left edge thereof, has been illustrated, as indicated by the irregular right-hand border line. Also, although the layers with complete vertical border lines are shown to approximate relative scale, the layers with interrupted vertical border lines (16, 12, 10, and 24) are actually substantially thickner than indicated so that their true thickness cannot be indicated on the scale of FIG. 1A. The entire thickness of the device is only slightly over 200 microns or about 0.2 mm, while its horizontal dimension is preferably about 2 or 3 centimeters, i.e., about 100 to 150 times its thickness.

The cell of FIG. 1A, which is the presently-preferred embodiment of the invention, will be described according to the method of fabricating same. A starting substrate 10 is of indium phosphide (InP), heavily doped with an n-type dopant ($n^+$). A moderately n-doped layer of indium gallium arsenide (InGaAs) 12 is epitaxially grown on substrate 10. Upon layer 12 a moderately doped p-type layer 14 of InP is epitaxially grown. Then an epitaxial layer 16 of gallium arsenide (GaAs) which is moderately doped with an n-type dopant ($n$) is grown upon layer 14. Lastly, a final epitaxial layer 18 of gallium aluminum arsenide (GaAlAs) which is moderately doped with a p-type dopant ($p$) is grown upon layer 16.

Over the entire bottom surface of substrate 10 a bottom contact 20 of metal (gold-germanium or tin plus nickel) is evaporated. The thusly-coated substrate is soldered by means of a solder layer 22 to a metal header 24.

Over the top or outer surface of uppermost layer 18 a top contact 26 of metal (preferably a silver-zinc alloy) is evaporated. A contact or external lead 28 is provided to top contact 26 by means of, for example, a thermocompression bond. An antireflective coating 30, such as silicon nitride, silicon oxide, or silicon dioxide is deposited over top layer 18.

A light concentrator 32 may be used to focus sunlight 38 from an area substantially wider than the top surface of the cell onto the top surface of the cell. Concentrator 32 can be a double convex lens as shown, but may alternatively comprise a focusing mirror, fresnel lens, etc.

In accordance with the invention and as will be explained infra, the lattice constant (dimension in angstroms (A) of recurring symmetrical portions in crystalline lattice) and bandgap (energy level in electron volts (eV) from the top of the valence band to the bottom of the conduction band) of each semiconductive layer in the cell of FIG. 1 have important functions in the invention. Therefore these parameters are diagramed in FIG. 1D, which is a plot of the lattice constant versus bandgap for the semiconductor layers in FIG. 1A. The boundary curve of materials which form the InGaAsP quaternary system is also shown in FIG. 1D for reference.

In particular, substrate layer 10 of InP has a bandgap of about 1.35 eV and a lattice constant of about 5.85 A.

The first epitaxial layer 12 of InGaAs has a lower bandgap (i.e., about 0.8 eV) but substantially the same lattice constant as layer 10. Thus layers 10 and 12 are lattice constant matched.

Next, moving upwardly to the second epitaxial layer 14 of InP, the lattice constant is the same as that of layer 12, but the bandgap increases to about 1.35 eV, the same value as for substrate 10. The lattice constant match between layers 12 and 14 provides a matched lattice constant junction or "active" energy converting junction according to the invention.

Moving to third epitaxial layer 16 of GaAs, note that the lattice constant decreases to about 5.65 A, but the bandgap stays substantially the same, i.e., increasing only slightly to about 1.42 eV. Thus a lattice constant mismatched or "inactive" junction is provided, again in accordance with the invention. Due to the mismatch in lattice constants between these two monocrystalline layers, a site of lattice dislocations (indicated by x's in FIG. 1B) will be formed around the junction between layers 14 and 16. As explained infra, these dislocations cause this junction to serve as a "connective" junction in accordance with the invention.

Moving upwardly to the final and uppermost epitaxial layer 18 of GaAlAs, it is seen that its lattice constant is matched to that of layer 16, thus forming a second active junction. The bandgap of layer 18 is about 2.2 eV.

In accordance with the invention and as will be discussed in more detail infra, the active junctions provide energy conversion sites while the connective junctions provide ohmic contacts between energy conversion sites.

FIG. 1B shows an energy band diagram of the semiconductor layers in FIG. 1 taken with respect to the Fermi level. The energy band diagram of FIG. 1B is aligned with the cross-sectional diagram of FIG. 1A so that the energy band of any layer in FIG. 1A can be determined by moving directly to the left along the horizontal broken lines.

Further physical details of the cell of FIG. 1A are now provided. Substrate 10 of InP is preferably n-doped with tin, tellurium, or selenium to a concentration of about $10^{18}$ dopant atoms per cubic centimeter (da/cc). The substrate preferably has a thickness of about 200 microns and may be made in any convenient size, e.g., a rectangle of about 2 × 3 cm. First epitaxial layer 12 of InGaAs preferably has a bandgap of about 0.8 eV, a thickness of about 5 microns, and is similarly n-doped to a concentration of about 2 × $10^{17}$ da/cc. The chemical composition would be approximately $In_{.44}Ga_{.56}As$.

The next expitaxial layer 14 of InP is preferably p-doped with zinc or magnesium to a concentration of about 4 × $10^{17}$ da/cc and has a thickness of about 2 microns.

The next epitaxial layer 16 of GaAs is about nine microns thick and is preferably formed in two stages: the first two microns by vapor epitaxial growth which is n-doped with Sn, Te, or S to a concentration of about $10^{19}$ da/cc, followed by liquid epitaxial growth which is also n-doped with Sn, Te, or S to a concentration of 5 × $10^{17}$ da/cc for the final seven microns.

The uppermost epitaxial layer 18 of GaAlAs preferably is p-doped with zinc or magnesium to a concentration of about 2 × $10^{18}$ da/cc and has a thickness of about 1 micron. The composition of the elements is about $Ga_{.25}Al_{.75}As$.

The bottom contact 20 is preferably formed by evaporation and alloying at about 400° C for about 15 seconds. Top contact 26 preferably has a thickness of about 5,000 A and the metallization pattern of FIG. 1C should take no more than a few percent of the entire upper area of the device inasmuch as such metallization blocks solar photons.

Antireflective coating 30 is preferably formed by sputtering or chemical vapor deposition in well-known fashion to a thickness of about ¼ of the wavelength of the predominant incident radiation. Such coating will decrease surface reflection between the air and the underlying semiconductive material so as to enable a greater percentage of incident photons to enter the device. Additional layers similar to 30 (not shown) will provide further reduction in reflectance.

During epitaxial growth of layer 14 on layer 12, and during growth of subsequent layers, some of the p-type dopant in layer 14 will diffuse into layer 12 due to the high temperatures used in such growth. Thus the opposite conductivity junction between layers 12 and 14 will occur at level 34, within layer 12 and just below its junction with layer 14. Similarly when layer 18 is grown upon layer 16, the opposite conductivity junction 36 therebetween will occur within layer 16, just below its junction with layer 18.

The elements employed in the various layers of FIG. 1A are all found in columns IIIA and VA of the periodic table and are preferred for use according to the invention. However, other semiconductive materials can be used in accordance with the invention as defined by the appended claims and their legal equivalents. For example compounds formed of elements in columns IIB and VIA such as CdS and CdTe could be used; also IB-IIIA-VIA compounds such as CuInS or variations thereof where, e.g., Se is substituted for S or Ga for In; also IIB-IVA-VA compounds such as ZnSnP. Also other IIIA-VA compounds can be used in lieu of the most-preferred IIIA-VA compounds previously discussed.

As indicated in FIG. 1, substrate 10 can alternatively be formed of gallium arsenide which is graded near the upper surface thereof to indium gallium arsenide in order to provide a lattice constant match with layer 12. Layer 14 as well as uppermost layer 18 may alternatively be formed of indium gallium phosphide ($In_x$-$Ga_{1-x}P$), provided the two compositions have different constituent proportions. If layer 14 is so formed, it will have the same bandgap as layer 16 so that the broken line in FIG. 1D connecting point 14 to point 16 will be horizontal, rather than sloped.

Further details of the III-V materials discussed above, the relationship between their lattice constants, bandgap, and alloy proportions, as well as methods of preparation and growth, can be obtained from the following references:

1. "III-V Quaternary Alloys" by Antypas, Moon, Edgecumbe, Bell, and the present inventor at pp. 48–54 of *Gallium Arsenide and Related Compounds*, Proceedings of Fourth International Symposium, Boulder, Colorado, September 1972, published by the Institute of Physics, London and Bristol, 1973;

2. "Bandgap and Lattice Constant of GaInAsP as a Function of Alloy Composition" by Moon, Antypas, and the present inventor, at 3 Journal of Electronic Materials 636–644 (1974) and references therein cited.

FIG. 1—Operation

As is well-known, when solar or other optical energy from source 38 impinges on the surface of a semiconductive junction with layers of matched lattice constants but differing conductivity types, e.g., junction 36 adjacent to the junction between layers 16 and 18, minority carriers (electrons and holes) will be generated in the conduction and valence bands in the regions of the semiconductive bodies adjacent junction 36. This will create a voltage difference across the opposite-conductivity junction which is proportional to and slightly less than the bandgap energy in electron volts of the layer in which the p-n junction occurs.

Thus in response to impingement of photons from source 38, a potential difference will be created across junction 36 which can provide a useful output current in accordance with the amount of energy falling on these layers. A light concentrator 32 may be advantageously employed to increase the amount of solar energy falling on these layers.

Those photons with energies lower than that of the bandgaps of layers 16 and 18 will not be absorbed or converted, but instead will pass through these layers, plus layer 14, to layer 12. Since layer 12 has a lower bandgap than layers 16 and 18, the incident photons which pass through layers 16 and 18 will be largely absorbed by layer 12 to be converted to electrical energy, thereby creating a potential difference across opposite conductivity junction 34. This potential difference will have the same polarity as the potential difference between layers 16 and 18 and a magnitude slightly less than the bandgap of layer 12.

The energy conversion site (junction 36) formed by layers 16 and 18 can thus be regarded as "tuned" to an upper energy range of photons, while the site (junction 34) formed by layers 12 and 14 can be regarded as "tuned" to a lower energy range of photons.

The junction between layers 14 and 16, which would seem to be reverse biased by the potential difference thereacross, will actually act as a substantial short circuit to connect the energy conversion sites 12–14 and 16–18 in series. The reason for this is that that junction area between layers 14 and 16, as indicated in FIG. 1B, contains many lattice defects caused by the rapid grading between the differing lattice constants of layers 14 and 16. These defects will act as recombination sites for carriers, whereby the many recombinations of electrons and holes at such sites will cause junction 14–16 to appear as a very low resistance ohmic contact or substantial short circuit to the current generated at the active junctions by photon action.

Thus according to the invention, by purposely providing a lattice mismatched opposite conductivity junction between lattice matched junctions, a connective junction is formed which will effectively connect the latter "active" junctions in series so as to efficiently convert plural photon energy ranges without the use of awkward contacts or other means which would be far less efficient for this purpose than a lattice mismatched junction. Thereby the solar photons falling on any given area can be converted to useful electrical current with far greater efficiency.

The two active junction cell of FIG. 1A will deliver, under optimum terrestrial solar illumination conditions ("air mass 1") an output voltage of about 1.56 volts and a power of about 254 watts per m².

Figure 2A:
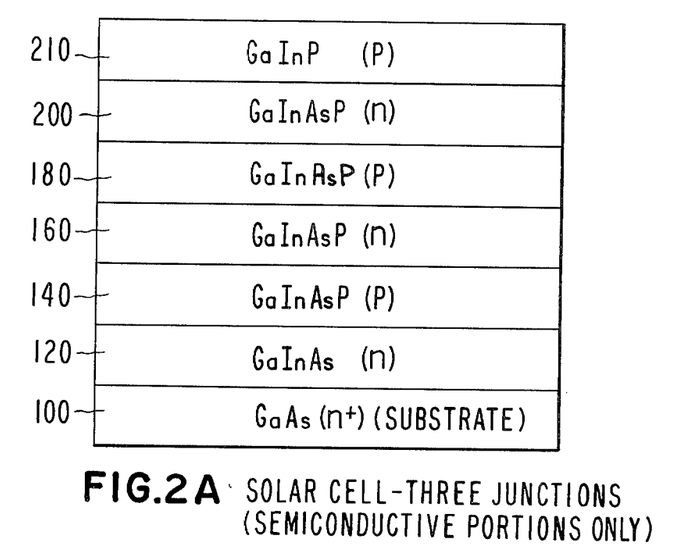
FIG. 2A is a cross-section of the semiconductive portions of a three-active junction solar cell in accordance with the invention.
Figure 2B:
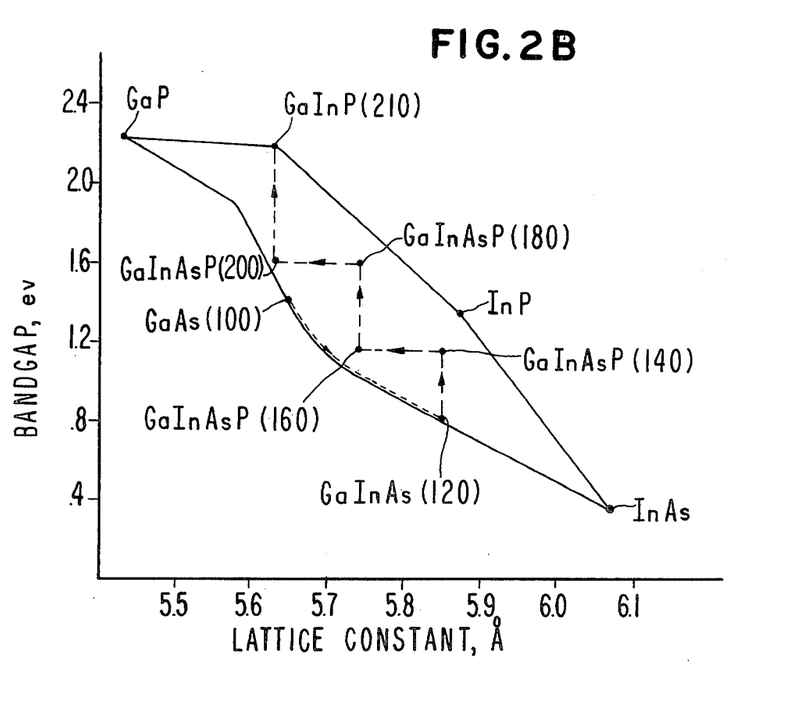
FIG. 2B is a lattice constant versus bandgap diagram of the cell of FIG. 2A.

FIG. 2 — Greater Numbers of Active Junctions

The principles employed in the two active junction cell of FIG. 1 can be carried further by providing stacks with greater numbers of layers in order to provide greater numbers of active junctions, each "tuned" to a separate photon energy range, thereby to convert photons with still greater efficiency. Adjacent active junctions of course should be interconnected by lattice mismatched junctions so that the total number of junctions in any cell is odd, with the number of active junctions being one greater than the number of lattice mismatched or "inactive" junctions.

FIG. 2A shows a solar cell with three active junctions and two inactive junctions for interconnecting the three active junctions in series. FIG. 2B shows a bandgap versus lattice constant diagram of the cell of FIG. 2A wherein the same reference numbers are employed to designate the respective layers in FIG. 2A.

The cell of FIG. 2A employs (not shown to scale) a GaAs substrate 100 which is heavily n-doped ($n^+$). Upon layer 100 a GaInAs (n) layer 120 is formed by epitaxial growth. Since, as indicated in FIG. 2B, the lattice constant of layer 120 differs substantially from that of layer 100, a transitional region in layer 100 (not shown) must be provided at the upper surface thereof to ease the transition to layer 120 in order to avoid a concentration of lattice dislocations. Thus the initial portion of layer 120 should be formed of GaAs by epitaxial deposition and then In should be gradually added to provide a final layer of GaInAs with the lattice constant and bandgap indicated in FIG. 2B.

Thereafter layer 140 of GaInAsP is epitaxially grown on layer 120. Layer 140 is latticed matched to layer 120 and has a substantially greater bandgap than layer 120 as indicated in FIG. 2B. Layer 140 is p-doped and the actual p-n junction would lie somewhere in the upper portion of layer 120, as previously indicated.

Layer 160 of n-doped GaInAsP is then epitaxially grown upon layer 140. As indicated, layer 160 has a substantially lower lattice constant than layer 140 and is thus lattice constant mismatched to layer 140, although it has the same bandgap as layer 140. The junction between junctions 140 and 160 will thereby be a connective junction which will act as a short circuit in accordance with the invention.

Layer 180 of GaInAsP (p-doped) is then grown upon layer 160 by epitaxial deposition. Layer 180 is lattice matched to layer 160 but has a substantially higher bandgap than layer 160. The p-n junction near the interface between layers 160 and 180 will lie somewhere in the upper surface of layer 160.

Layer 200 of GaInAsP (n-doped) is then epitaxially grown upon layer 180. Layer 200 is lattice mismatched to layer 180, thus providing another connective junction. Layer 200 has the same bandgap as layer 180.

Finally layer 210 of GaInP (p-doped) is grown upon layer 200 and has a lattice match (but different bandgap) than layer 200.

The three active junction device of FIG. 2 will operate in the same manner as the device of FIG. 1 except that a greater overall conversion efficiency of incident photons will occur because more active junctions, each tuned to a narrower energy band, will provide a greater conversion efficiency. The output voltage will be greater in the device of FIG. 2 than in the device of FIG. 1 because of the greater number of active junctions in series.

The actual atomic fractions of the III-V elements in the layers can be derived from the chart of FIG. 2B and the topological chart of FIG. 1 of the paper by Moon, Antypas, and the present inventor in *Journal of Electronic Materials*, op cit. The usual contact, header, and antireflective coatings (not shown) should be provided as in FIG. 1A.

Figure 3:
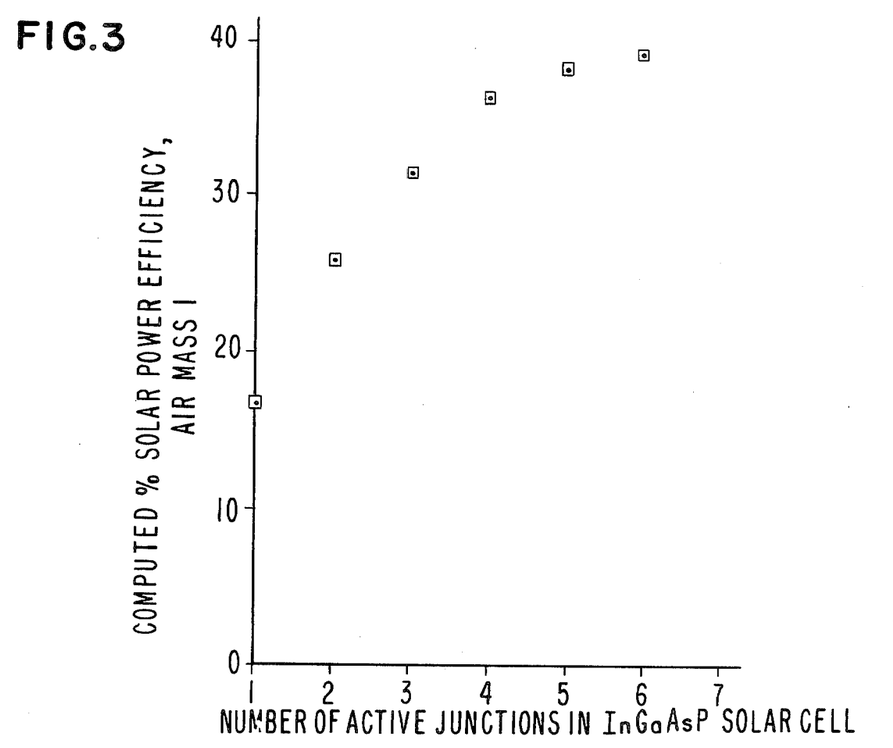
FIG. 3 is a plot of solar power efficiency versus number of active junctions for cells in accordance with the invention.

FIG. 3 — Maximum Active Junctions

As the number of active junctions in a device is increased, a greater conversion efficiency of the incident solar photons to output power will occur. But of course this extension of junctions has a practical limit due to the fact that the efficiency of each junction is dependent upon the open circuit voltage of the junction which is roughly proportional to the logarithm of the current which the junction is generating. As the number of junctions is increased, each junction generates a smaller current. When the power generated by each active junction is added and divided by the maximum available incident power from solar radiation, an indication of efficiency can be provided. A computer program has been devised to calculate the maximum solar power conversion efficiency under optimum terrestial sunlight condition (air mass 1) for the number of junctions in a solar cell employing III-V materials (In, Ga, As, Al, and P). The bandgaps of the respective layers are so arranged such that the optimum current output of each active junction is the same, giving the best efficiency in the series connection. The output of this program, indicated in FIG. 3, shows that the efficiency rapidly becomes asymptotic to about 40% at about 6 junctions.

In addition to increasing the internal efficiency, increasing the number of junctions also gives an increased output voltage and decreases the current density through the device because the photon flux density absorbed adjacent each junction decreases. Thus with increased junctions, a higher output voltage and lower current will be provided. This mode is desirable because it reduces losses in efficiency due to contact resistance and spreading resistance effects. I.e., it permits higher values of concentration of solar energy before contact resistance or spreading resistance effects become truly significant.

The following table indicates the approximate power efficiency, open circuit voltage, and output current density for InGaAsP cells with various numbers of active junctions.

| Number of Junctions | Power Efficiency | Open Circuit Voltage | Output Current Density (ma/cm$^2$) |
|---|---|---|---|
| 1 | 16.6% | 1 volt | 16.3 |
| 2 | 26 % | 1.56 volts | 16.3 |
| 3 | 31.6% | 2.53 volts | 12.2 |
| 4 | 36.4% | 3.52 volts | 10.3 |
| 6 | 39 % | 5.45 volts | 7.2 |

Figure 4A:
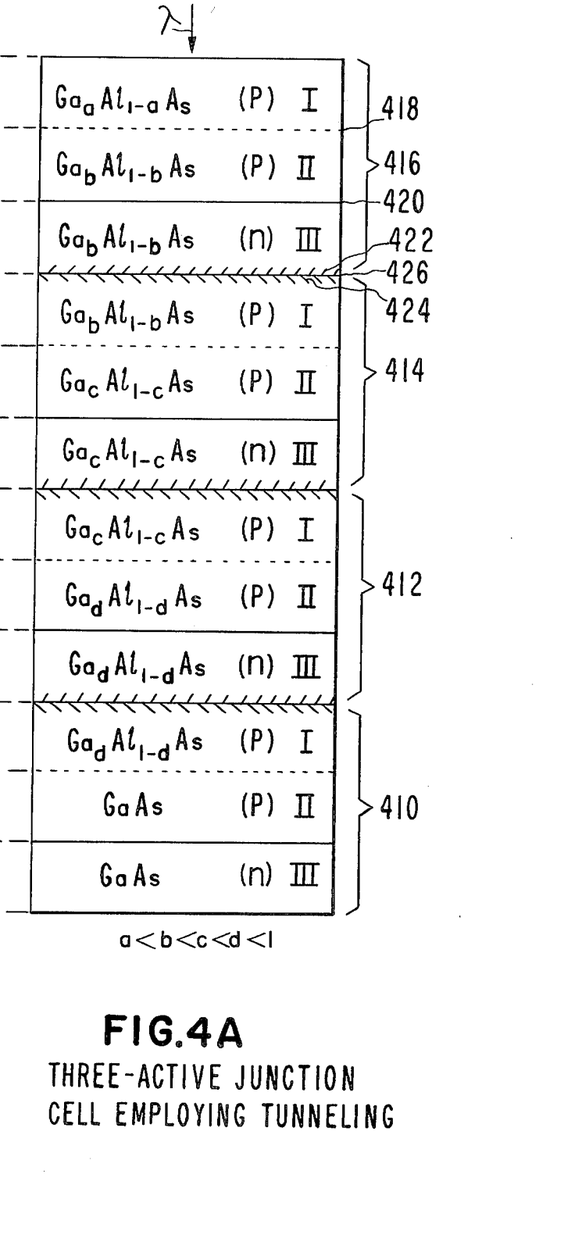
FIG. 4A shows a three-active junction cell employing the tunnelling phenomenon to effect connective junctions and FIG. 4B shows an energy band diagram for the cell of FIG. 4A.
Figure 4B:
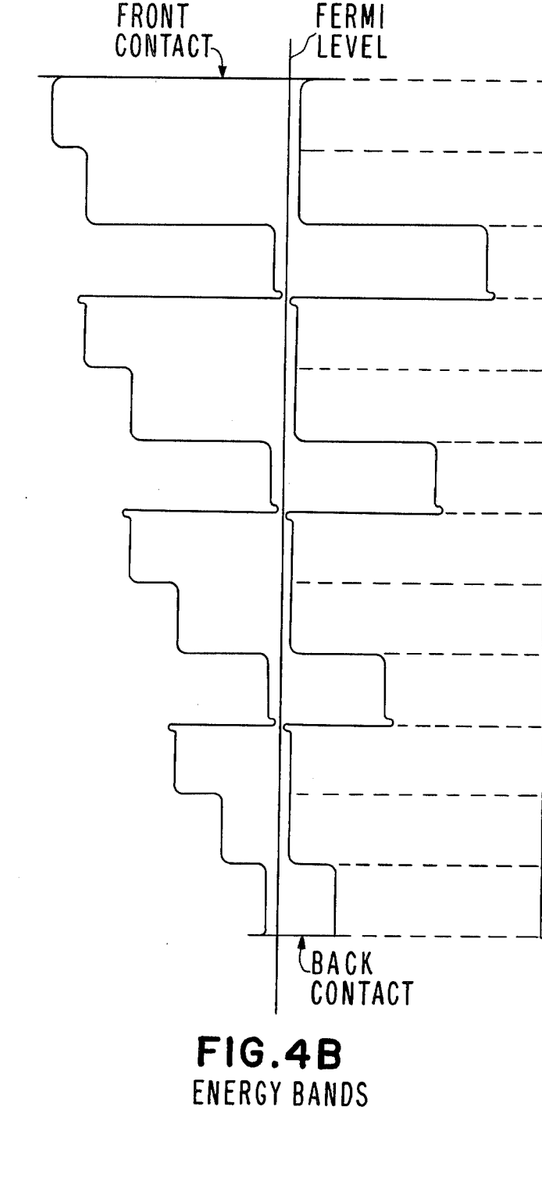

FIG. 4 — Connective Junctions Employing Tunnelling

According to another embodiment of the invention, connective junctions are provided which employ the phenomenon of tunnelling to provide low resistance ohmic interconnections between the energy conversion sites formed by active junctions. As is well known, and as described in Ezaki/Kurose U.S. Pat. No. 3,033,714, May 8, 1962, when a relatively narrow semiconductive junction is formed of opposite conductivity layers having very high dopant concentrations adjacent the junction, a high potential barrier will exist, but carriers will be able to traverse this barrier in the reverse direction by "tunnelling" thereunder even though the potential difference across the junction is less than the potential barrier.

An example of this "tunnelling" embodiment is illustrated by the device of FIG. 4A, whose energy band diagram is shown in FIG. 4B. The device comprises a fouractive junction cell having four sections 410, 412, 414, and 416, each of which consists of three successive layers, I, II, and III.

In each section, such as 416, the uppermost, light entrance layer, I, is a relatively wide bandgap layer which is doped to be of p-type conductivity and which confines minority carriers. The intermediate layer II has a lower bandgap and is also doped to be of p-type conductivity; it serves to absorb light and create electron-hole pairs. The junction between layers I and II is indicated by a dotted line 418 since both layers are of the same conductivity type (although having different elemental proportions, as explained infra).

The bottom layer III is doped to be of n-type conductivity and of the same bandgap as layer II. It forms a p-n active junction with layer II, so that incident photons will create a photovoltage across this junction, which is indicated by a solid line 420.

The bottom portion 422 of layer III in section 416 (416-III) is very heavily doped ($10^{20}$ to $10^{21}$ da/cc) with n-type impurity atoms. Similarly, the top portion 424 of layer 414-I is very heavily doped with p-type impurity atoms so that the junction 426 formed between these two layers (and between adjacent sections 414 and 416) will be able to pass carriers through the potential barrier by the tunnelling phenomenon aforementioned.

Junction 426 thus serves as a connective junction which provides a low resistance connection between sections 414 and 416.

In like manner, similar "tunnel-type" connective junctions are provided between sections 410 and 412, plus sections 412 and 414.

Each layer in each section of the illustrated example is formed of gallium-aluminum-arsenide ($Ga_xAl_{1-x}As$), except that the bottom two layers in the stack, 410-II and 410-III, are formed of gallium arsenide (GaAs). Layer 410-III is the starting substrate and all subsequent layers are grown thereover epitaxially in well-known fashion.

As noted on the drawing, the proportions of gallium and aluminum in layers II and III of each section (except 410) are identical and are identical to that of layer I of the next lowermost section. Layer I of section 416 is unique in composition since section 416 is the topmost layer.

It will be apparent from the chemical formulae illustrated in the drawing and the legend thereunder that the percentage of gallium decreases going toward the top of the stack, while the percentage of aluminum, being complimentary, increases. For maximum efficiency, the GaAlAs composition should be changed in steps which are calculated from the solar spectrum so that each cell or active junction will generate the same current. Stated differently, the integral of the photon flux over the photon energy range between the bandgaps of layers I and II should be nearly identical for each cell for optimum efficiency.

Other materials than the GaAl/GaAlAs system illustrated can of course be used in this tunnelling embodiment. For example an InGaAsP system, as in the FIG. 1A embodiment, would provide increased efficiency since it could convert energy in the longer wavelength portion of the solar spectrum. It could be stepped from InGaP to InGaAs along a constant lattice-constant line of approximately 5.8A.

While the above description contains many specificities, these should not be construed as limitations upon the scope of the invention since many variations thereof are possible. For example, and as stated, many other semiconductive materials can be employed to provide an increase in solar conversion efficiency according to the invention. Also many other ways of stacking, growing, and positioning the layers will be envisioned. Therefore the true scope of the invention should be determined only by the appended claims and their legal equivalents.

What is claimed is:

1. A photovoltaic cell comprising:

a. a first epitaxial layer of semiconductive material comprising a first given compound selected from the group consisting of IIB-VIA, IB-IIIA-VIA, and IIIA-VA compounds, said compound capable of being either *p* or *n* conductivity type, a portion of said layer, starting from the bottom surface thereof, being of a given conductivity type, the remaining portion of said layer, comprising the portion of said layer adjacent the upper surface thereof, being of a conductivity type opposite to said given type and such that a rectifying junction is formed in said layer parallel to the upper and lower surfaces thereof, said layer having a given bandgap and a given lattice constant, b. a second epitaxial layer of semiconductive material joined to the upper surface of said first epitaxial layer and comprising a second given compound selected from the group consisting of IIB-VIA, IB-IIIA-VIA and IIIA-VA compounds, said compound capable of being either *p* or *n* conductivity type, said layer being of said opposite conductivity type, said layer having a given bandgap at least as high as that of said first epitaxial layer, said layer having substantially the same lattice constant as that of said first epitaxial layer, said second epitaxial layer being joined to the upper surface of said first epitaxial layer so as to form a first heterojunction of like conductivity with the upper portion of said first epitaxial layer, c. a third epitaxial layer of semiconductive material comprising a third given compound selected from the group consisting of those IIB-VIA, IB-IIIA-VIA and IIIA-VA compounds, said compound capable of being either *p* or *n* type, a bottom portion of said layer, starting from the bottom surface thereof, being of said given conductivity type, the remaining portion of said layer, comprising the portion adjacent the upper surface thereof, being of said opposite conductivity type such that a rectifying junction is formed in said layer parallel to the upper and lower surfaces thereof, said layer having a given bandgap higher than the bandgap of said first epitaxial layer, said third epitaxial layer being joined to the upper surface of said second epitaxial layer so as to form a second heterojunction of opposite conductivity with said second epitaxial layer, said second and third epitaxial layers comprising means providing a substantial short circuit between said second and third epitaxial layers in a direction opposite to what would be the direction of easy current flow across a rectifying heterojunction formed by said second and third epitaxial layers in absence of said means providing said substantial short circuit.

2. The photovoltaic cell of claim 1 further including a fourth epitaxial layer of semiconductive material joined to the upper surface of said third epitaxial layer and comprising a fourth given compound selected from the group consisting of IIB-VIA, IB-IIIA-VIA and IIIA-VA compounds, said layer being of said conductivity type opposite to said given conductivity type, said layer having a given bandgap at least as high as that of said third epitaxial layer, said layer having substantially the same lattice constant as that of said third epitaxial layer, said fourth epitaxial layer being joined to the upper surface of said third epitaxial so as to form a third heterojunction of like conductivity with the upper portion of said third epitaxial layer.

3. A photovoltaic cell comprising:

a. a first epitaxial layer of semiconductive material comprising a first given combination of elements selected from columns IIIA and VA of the Periodic Table, a portion of said layer, starting from the bottom surface thereof, being doped with impurity atoms of a given element in a sufficient concentration to cause said portion to be of a given conductivity type, the remaining portion of said layer, comprising the portion of said layer adjacent the upper surface thereof, being doped with impurity atoms of a different given element in a sufficient concentration to cause said portion to be of a conductivity type opposite to said given type and such that a rectifying junction is formed in said layer parallel to the upper and lower surfaces thereof, said layer having a given bandgap within the range of 0.4 to 2.3 electron volts and a given lattice constant within the range of 5.4 to 6.1 Angstrom units, b. a second epitaxial layer of semiconductive material joined to the upper surface of said first epitaxial layer and comprising a second given combination of elements selected from columns IIIA and VA of the Periodic Table, said layer being doped with impurity atoms of a given element in a sufficient concentration to cause said layer to be of said opposite conductivity type, said layer having a given bandgap within the range of 0.4 to 2.3 electron volts, said layer having substantially the same lattice constant as that of said first epitaxial layer, said second epitaxial layer being joined to the upper surface of said first epitaxial layer so as to form a first heterojunction of like conductivity with the upper portion of said first epitaxial layer, c. a third epitaxial layer of semiconductive material comprising a third given combination of elements selected from columns IIIA and VA of the Periodic Table, a bottom portion of said layer, starting from the bottom surface thereof, being doped with impurity atoms of a given element in a sufficient concentration to cause said predominant portion to be of said given conductivity type, the remaining portion of said layer comprising the portion adjacent the upper surface thereof being doped with impurity atoms of a different given element in a sufficient concentration to cause said region to be of said opposite conductivity type and such that a rectifying junction is formed in said layer parallel to the upper and lower surfaces thereof, said layer having a given bandgap within the range of 0.4 to 2.3 electron volts and higher than the bandgap of said first epitaxial layer, said third epitaxial layer being joined to the upper surface of said second epitaxial layer so as to form a second heterojunction of opposite conductivity said said second epitaxial layer, said second and third epitaxial layers thus providing a rectifying junction, said second and third epitaxial layers comprising means providing a substantial short circuit between said second and third epitaxial layers in a direction opposite to the direction of easy current flow across the rectifying heterojunction formed by said second and third epitaxial layers.

4. The cell of claim 3 wherein said third epitaxial layer has a substantially different lattice constant than that of said second epitaxial layer such that said second heterojunction has sufficient lattice defects thereat so as to provide said substantial short circuit of said third epitaxial layer with said second epitaxial layer.

5. The cell of claim 3 wherein the contiguous areas of said second and third epitaxial layers are sufficiently heavily doped with opposite conductivity dopants to provide a tunnel junction which provides said substantial short circuit of said third epitaxial layer with said second epitaxial layer.

6. The photovoltaic cell of claim 3 further including a fourth epitaxial layer of semiconductive material joined to the upper surface of said third epitaxial layer and comprising a fourth given combination of elements selected from columns IIIA and VA of the Periodic Table, said layer being doped with impurity atoms of a given element in a sufficient concentration to cause said layer to be of said conductivity type opposite to said given conductivity type, said layer having a given bandgap within the range of 0.4 to 2.3 electron volts, said layer having substantially the same lattice constant as that of said third epitaxial layer, said fourth epitaxial layer being joined to the upper surface of said third epitaxial layer so as to form a third heterojunction of like conductivity with the upper portion of said third epitaxial layer.

7. The cell of claim 6 wherein the first epitaxial layer is InGaAs, the second epitaxial layer is InP, the third epitaxial layer is GaAs, and the fourth epitaxial layer is GaAlAs.

8. The cell of claim 3 wherein said first epitaxial layer is InGaAs, the second epitaxial layer is InP, and the third epitaxial layer is GaAs.

9. The cell of claim 3 wherein an antireflective coating is provided over the outermost layer in the stack of said layers.

10. The converter of claim 3, further including light concentrator means for directing and concentrating incident light upon the outermost layer of the stack of said layers.

* * * * *